United States Patent
Laermer

(10) Patent No.: US 10,490,403 B2
(45) Date of Patent: Nov. 26, 2019

(54) METHOD FOR MASKING A SURFACE COMPRISING SILICON OXIDE

(71) Applicant: Robert Bosch GmbH, Stuttgart (DE)

(72) Inventor: Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 378 days.

(21) Appl. No.: 14/783,464

(22) PCT Filed: Mar. 18, 2014

(86) PCT No.: PCT/EP2014/055361
§ 371 (c)(1),
(2) Date: Oct. 9, 2015

(87) PCT Pub. No.: WO2014/166706
PCT Pub. Date: Oct. 16, 2014

(65) Prior Publication Data
US 2016/0035570 A1    Feb. 4, 2016

(30) Foreign Application Priority Data

Apr. 12, 2013    (DE) .......................... 10 2013 206 527

(51) Int. Cl.
| | | |
|---|---|---|
| *H01L 21/033* | (2006.01) | |
| *H01L 21/308* | (2006.01) | |
| *H01L 21/3213* | (2006.01) | |
| *H01L 21/02* | (2006.01) | |
| *H01L 21/311* | (2006.01) | |

(52) U.S. Cl.
CPC ..... *H01L 21/0337* (2013.01); *H01L 21/02164* (2013.01); *H01L 21/0332* (2013.01); *H01L 21/3081* (2013.01); *H01L 21/31111* (2013.01); *H01L 21/32139* (2013.01)

(58) Field of Classification Search
CPC ............. H01L 21/0332; H01L 21/0337; H01L 21/02164
See application file for complete search history.

(56) References Cited

U.S. PATENT DOCUMENTS

| | | | | |
|---|---|---|---|---|
| 5,262,282 A | * | 11/1993 | Hieda | ............... G03F 7/038 257/E21.026 |
| 5,453,395 A | * | 9/1995 | Lur | ............... H01L 21/02282 257/E21.271 |
| 5,612,239 A | | 3/1997 | Lin et al. | |
| 5,773,335 A | | 6/1998 | Chao | |
| 6,090,726 A | | 7/2000 | Lee | |
| 2002/0106865 A1 | | 8/2002 | Chen et al. | |
| 2009/0274873 A1 | * | 11/2009 | Shinotsuka | ............ B82Y 10/00 428/143 |

FOREIGN PATENT DOCUMENTS

| | | |
|---|---|---|
| CN | 2480380 Y | 3/2002 |
| JP | H05-326504 A | 12/1993 |

OTHER PUBLICATIONS

International Search Report corresponding to PCT Application No. PCT/EP20141055361, dated Aug. 18, 2014 (German and English language document) (5 pages).

* cited by examiner

*Primary Examiner* — Nathan H Empie
(74) *Attorney, Agent, or Firm* — Maginot, Moore & Beck LLP

(57) ABSTRACT

A method for masking a surface, in particular a surface having silicon oxide, aluminum or silicon, includes providing a substrate having a surface to be masked, in particular having a surface having silicon oxide, aluminum or silicon; and producing a defined masking pattern by locally selective forming of colloidal silicon oxide on the surface. The method allows for the creating of an extremely stable masking in a simple and cost-effective manner, in contrast to a plurality of etching media, in particular in contrast to hydrofluoric acid, in order to thus create extremely accurate and defined structures such as by an etching process.

11 Claims, No Drawings

METHOD FOR MASKING A SURFACE COMPRISING SILICON OXIDE

This application is a 35 U.S.C. § 371 National Stage Application of PCT/EP2014/055361, filed on Mar. 18, 2014, which claims the benefit of priority to Serial No. DE 10 2013 206 527.2, filed on Apr. 12, 2013 in Germany, the disclosures of which are incorporated herein by reference in their entirety.

The disclosure relates to a method for masking a surface, in particular a surface comprising silicon oxide, aluminum or silicon. The disclosure relates further to the use of colloidal silicon oxide for selectively masking a surface to be treated, in particular against a subsequent etching in etching media comprising hydrofluoric acid, for example against subsequent etching in hydrofluoric acid vapor.

BACKGROUND

Etching media comprising hydrofluoric acid, in particular hydrofluoric acid vapor, are frequently used in microsystems technology for so-called sacrificial layer etching, wherein micromechanical structures on a silicon oxide layer are rendered freely movable by undercutting. The advantage of the use of hydrofluoric acid vapor is that, as a result of the "semi-dry" procedure, so-called sticking, that is to say irreversible adhesion of the completely undercut structures to the substrate or to other structural parts, can be prevented.

Document US 2002/0106865 A1 describes a method of forming a shallow trench isolation. In such a method, a second oxide is selectively deposited from the liquid phase onto the surface of a first oxide using an oversaturated aqueous fluorosilicic acid solution, in which the deposition takes place.

From document U.S. Pat. No. 5,453,395 there is further known a method of forming an isolation structure on a silicon substrate, in which a selective deposition of an oxide only in trenches of the substrate is to be carried out.

SUMMARY

The disclosure provides a method for masking a surface, in particular a surface comprising silicon oxide, aluminum or silicon, having the following method steps:
a) providing a substrate having a surface to be masked, in particular having a surface comprising silicon oxide, aluminum or silicon; and
b) producing a defined masking pattern by locally selective formation of silicon oxide on the surface.

The above-described method permits the creation in a simple and inexpensive manner of a mask that is extremely stable towards a large number of etching media, such as in particular towards hydrofluoric acid, in order thus to create extremely precise and defined structures, for example by an etching operation.

To that end, the method for masking a surface, in particular a surface comprising silicon oxide, aluminum or silicon, comprises according to method step a) providing a substrate having a surface to be masked, in particular having a surface comprising silicon oxide, aluminum or silicon. In this method step there is accordingly provided a substrate, or a starting component, which has a surface that can preferably comprise at least in part silicon oxide, usually silicon dioxide ($SiO_2$), aluminum or silicon. For example, the corresponding surface or also the substrate can consist of one or more of the above-mentioned materials, wherein the silicon oxide, for example, can be applied to the surface by a thermal oxidation of a silicon surface or also by deposition of an oxide on a silicon surface. From such a substrate there can be formed in particular an electronic or micromechanical structural element by, after masking, selectively removing specific regions therefrom in particular by an etching process in order thus to generate defined functional structures. As regards the aluminum surface, it can be, for example, an aluminum contacting which can be used, for example, in electronic circuits.

Accordingly, masking within the meaning of the disclosure can be understood in particular as meaning selectively passivating or covering individual regions of a surface to be treated and correspondingly leaving other regions of the surface exposed. Masking can accordingly be understood as meaning a defined structure of passivated regions next to treatable regions, wherein the passivation or covering can always relate to a specific treatment for which the masked regions or passivated regions are inactive or inert or protected.

In the above-described method, masking of the surface takes place according to method step b) by producing a defined masking pattern by locally selective formation of colloidal silicon oxide on the surface. Accordingly, in the above-described method, the surface of the component or substrate to be treated is provided locally or spatially selectively with colloidal silicon oxide. Masking of regions that are not to be treated is accordingly effected by the colloidal silicon oxide, whereas the regions that are free of colloidal silicon oxide can be subjected to a further treatment, such as in particular an etching process. In other words, colloidal silicon oxide is applied spatially selectively and thus in a defined manner to the positions on the surface which are to be protected during a further process step, for example in a subsequent etching operation, at which positions etching is accordingly not to take place. Controlled passivation or masking of surfaces, for example wafer surfaces, is accordingly effected in order, for example, to protect oxide that is to be protected from a treatment such as, for example, an attack by hydrofluoric acid vapor, for example, but also by potassium hydroxide solution and other etching media.

Colloidal silicon oxide can be understood as being a silicon oxide which can form on the surface in a very fine structural size upon drying and concentration of a saturated or supersaturated fluorosilicic acid solution. This compound which precipitates from the fluorosilicic acid upon drying can optionally further fluorine and/or optionally bound water in addition to silicon and oxygen. It can be described chemically, by way of example and without implying any limitation, by an empirical formula $Si_xO_yF_z*nH_2O$, wherein x and y and z and n can be, for example, 1, 2 or 3 or larger whole-number multiples of 1 (x,y,z=1, 2, 3, . . . ; n=1, 2, 3 . . . ). The colloids can form as a result of a reaction of fluorosilicic acid to silicon oxide clusters with the liberation of hydrofluoric acid. This effect is known per se and is feared in the semiconductor industry under the term "staining" or "stains", because this colloid formation, for example upon removal of native oxides before gate oxidation, leads to defects in the semiconductors, for example the subsequently produced gate oxides.

In particular owing to this colloidal silicon oxide which is formed, for example, from the drying fluorosilicic acid on a wafer surface, for example, it is possible to produce a very stable and resistant masking which is highly resistant to a large number of etching media and by means of which a precisely defined structure or often simply protection of underlying layers can thus be achieved. The colloidal silicon oxide, also referred to as "stains", on the substrate surface, such as in particular oxide surfaces, first slows down oxide etching and finally brings it to a complete standstill. Such a surface is substantially completely inert and withstands even harsh etching attacks over prolonged periods.

In detail, a masking of colloidal silicon oxide against, for example, the action of hydrofluoric acid as a frequently used etching medium is particularly resistant even with long-term use against the formation of defects, for example against the formation of so-called pinholes in underlying oxide layers. Moreover, in addition to an attack with formation of mechanical damage, diffusion of the hydrofluoric acid through the masking or through the protective layer, for example, can reliably be prevented even at elevated temperatures or, for example, in the case of alcohol additions. The masked regions of the surface of the component or substrate are thus reliably protected against the action of such aggressive etching substances.

A masking or a protective layer of colloidal silicon oxide is also inert towards reactions with a large number of etching media, such as in particular towards a reaction with hydrofluoric acid. Because it is a specific silicon oxide, it will in most cases generally not impair the subsequent performance of the component that is produced, so that in most cases the layer does not have to be removed in a complex further method step.

It can be simple and inexpensive in terms of process technology to obtain the spatially selective masking next to active regions on the same substrate, which has adequate stability even over a prolonged period of time. Despite its stability towards etching with any chemicals as well as etching solutions or vapors comprising hydrofluoric acid, or also towards heat treatment, in particular high-temperature treatment, a masking of a colloidal silicon oxide can be removed, if desired, by physical methods such as mechanical abrasion or ion sputtering processes.

In summary, by means of an above-described masking there can be provided in particular a method which, during treatment of a surface, such as in particular a sacrificial layer etching, which is based on the action of hydrofluoric acid vapor, for example in the region of micromechanical structures such as a wafer, can reliably ensure the protection of functional oxides, for example oxide layers in the region of micromechanical circuits, and can further prevent failures from occurring in the region of the microelectronic circuits of the components that are produced.

Within the context of one embodiment, the selective formation of colloidal silicon oxide can take place by a spatially selective and successive application and drying of fluorosilicic acid ($H_2SiF_6$) to the surface. Accordingly, in this embodiment, use is made of the so-called staining effect which can occur under particular preconditions during etching of silicon oxides with etching media comprising hydrofluoric acid. In this embodiment, therefore, use is made of the fact that colloidal silicon oxide ($SiO_{2,coll.}$), which is stable and can no longer be etched, can form under particular preconditions when hydrofluoric acid acts on silicon oxide or when fluorosilicic acid is used.

Depending on the surface used, fluorosilicic acid can be applied directly, or the colloidal silicon oxide can form as a product of the silicon oxide etching by hydrofluoric acid with formation and subsequent decomposition of aqueous fluorosilicic acid during drying, in particular according to the following reactions:

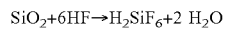
(1)

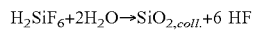
(2), wherein reaction equation (1) represents an etching of silicon oxide as native oxide by means of hydrofluoric acid, and reaction equation (2) describes, by way of example and without implying any limitation, the precipitation of colloidal silicon oxide ($SiO_{2,coll.}$) from a concentrated etching solution, in particular upon drying of etching solution residues on a substrate surface. The colloidal silicon oxide can also be referred to as stain and is a reaction product which differs in terms of its structure from the originally etched silicon oxide and is no longer capable of back-reaction but is stable in that form.

In this embodiment, concentrated solution of aqueous fluorosilicic acid ($H_2SiF_6$), for example, can selectively be applied to and dried on those regions of the surface which are not subsequently to be treated, for example etched, but instead are to be masked. Drying can take place at room temperature in the air, or appropriately known heating devices are used, such as, for example, a hotplate, a radiant heater, or a hot air fan, or an oven. Fluorosilicic acid can thereby be produced, for example, in situ, for example by reacting the silicon oxide of the silicon-oxide-containing surface or also quartz glass (fused silica $SiO_2$) in concentrated aqueous hydrofluoric acid or anhydrous hydrofluoric acid, to which a small amount of water can be added at the start of the etching reaction, according to reaction (1) described above. Thus, according to reaction equation (1), aqueous concentrated fluorosilicic acid is formed, which is suitable for precipitating colloidal silicon oxide stains upon drying by hydrolytic cleavage according to reaction equation (2), wherein the hydrofluoric acid formed is able to escape in gas form. Alternatively, pre-prepared fluorosilicic acid can be used directly and immediately according to reaction equation (2).

Within the context of a further embodiment, fluorosilicic acid can be applied selectively to the surface by printing, spin coating, atomization or spreading the fluorosilicic acid or by dipping the surface in fluorosilicic acid or by printing the surface with fluorosilicic acid. In the case of printing, a pattern of fluorosilicic acid corresponding to the required masking of the surface is "stamped" or applied by spraying in the form of small drops analogously to an inkjet printer. Patterns can thereby be produced directly on the surface. In these embodiments in particular, simple and defined and uniform or homogeneous application of fluorosilicic acid to the surface containing, for example, silicon oxide is possible. The above-mentioned embodiments are particularly suitable in combination with the production of an upstream masking pattern, as will be explained in detail below. The upstream application types can always take place repeatedly in succession, in each case followed by a step of drying the fluorosilicic acid. In other words, a multiple application of fluorosilicic acid followed by drying, in particular in combination with the above-mentioned application types, can be carried out.

With regard to the method variant of spin coating, the substrate, for example a wafer, can be positioned in a centrifuge, for example a wafer centrifuge, whereupon the fluorosilicic acid is applied to the centrifuge dropwise or by spraying and the substrate is provided uniformly with the fluorosilicic acid and the same is dried. A wafer centrifuge comprises a wafer receiver, into which the wafer is inserted. The wafer receiver with the wafer then rotates at a predetermined speed. Such wafer centrifuges are used, for example, to apply photoresist layers, or also for various cleaning steps with solvents, or for wafer drying analogously to a "spin-drier". These steps can then be repeated several times. Regarding atomization of the fluorosilicic acid, the acid can be dusted by means of an atomizer onto the surface to be treated and dried, wherein these steps can likewise be repeated several times. With regard to dipping, the surface to be treated can be dipped into a fluorosilicic acid solution and removed from the solution and then placed, for example, with its bottom face on a hotplate, as a result of which the surface is dried. These steps can also be repeated several times.

With regard to wiping, the fluorosilicic acid can be applied, for example, using a spatula or a wiper, wherein the wiper can be in the form of a window wiper, for example a windscreen wiper for a motor vehicle, or in particular can have a wiper blade. The wiper, in particular the wiper blade, can apply the fluorosilicic acid uniformly using a plurality of outlet openings which are arranged, for example, on the wiper and can be connected to a reservoir for fluorosilicic acid solution, and which can be distributed over the length of the wiper blade, and can distribute the solution finely over the surface by means of the wiper blade. When the wiper blade has distributed the fluorosilicic acid, the fluorosilicic acid can start to dry in order to form the silicon oxide before the surface is optionally treated again with the fluorosilicic acid.

Within the context of a further embodiment, the method can comprise, before method step b), the further method step: c) masking the surface to form a negative masking pattern. In this embodiment, colloidal silicon oxide can be formed spatially selectively on the surface in a manner which is particularly defined and simple in terms of process technology. In detail, a negative masking pattern can be produced, which within the meaning of the disclosure is to mean in particular that the regions which are to be fed to a subsequent treatment, such as a subsequent etching, are masked, whereas the further regions are exposed. The masking pattern applied in this method step is accordingly precisely the opposite of the masking pattern that is in principle to be formed in the masking method by the formation of colloidal silicon oxide. Accordingly, in this embodiment, the regions which are not to be provided with a colloidal silicon oxide can be pre-masked particularly simply, which regions are thus treated after masking.

For example, the formation of such a negative masking pattern can greatly simplify the application of fluorosilicic acid to precisely those areas which are to be provided with colloidal silicon oxide, which can make the procedure particularly simple and thus time-saving and inexpensive.

Within the context of a further embodiment, the negative masking pattern can be produced using a photoresist. In particular by using a photoresist, a particularly defined and high-resolution marking pattern can be produced. Moreover, the use of a photoresist is in principle a technically mature method and is thus possible without problems in terms of process technology.

In this embodiment, the photoresist can be applied, for example by spin coating, to the entire surface and can then be removed by exposure and development from those regions which are to be passivated or rendered inert by the application of colloidal silicon oxide. In the case of a monolithic integrated MEMS sensor or a monolithic integrated MEMS microphone, for example, photoresist can be removed, for example, from the regions of the electronic circuits in order subsequently to be able to perform a passivation or masking by colloidal silicon oxide in those areas in order thus to protect the corresponding circuits. In one embodiment, a MEMS region, or an active microphone region, can remain covered with photoresist because masking effected by means of colloidal silicon oxide is not to take place there, because etching is to be carried out in that region in a subsequent step. A positive photoresist that is conventional in the semiconductor industry of type AZ8112 or AZ4620 etc. can be used, which photoresist is spin coated in a thickness of from 1 μm to 6 μm and is then exposed and developed. In the case of a positive resist such as AZ8112, the exposed regions are removed upon development. It is equally possible to use so-called steppers, which are optimized for the use of stepper exposure units. So-called negative resists or image reversal resists can likewise be used, in which exposed regions are retained upon development and unexposed regions are removed, conversely to a positive resist.

Following subsequent masking by formation of colloidal silicon oxide, the photoresist having the negative masking can be removed again in a simple manner. For example, the masking can be removed using suitable solvents, for example acetone, dimethyl sulfoxide (DMSO), ethyl acetate, dimethyl ketone or so-called resist removers in a standard process, which is also referred to as the lift-off process. Because both positive resists and negative resists are suitable here, the solvent can in particular be chosen in dependence on the specific resist that is used. A further possibility for removing the photoresist is the use of an oxygen plasma, for example using a so-called oxygen plasma stripper, because no stable strains or no stable colloidal silicon oxide form on the resist surfaces, so that the resist is not protected by a dense layer before the action of the oxygen or of the oxygen plasma.

Within the context of a further embodiment, drying can take place using an oven, a heating plate also referred to as a hotplate, a hot air fan, a radiant heater or by air drying, in particular at room temperature. By means of the above-mentioned methods in particular, drying can take place with concentration in particular of fluorosilicic acid solution, so that colloidal silicon oxide forms. The methods are also gentle, so that the substrate to be masked is not damaged.

Within the context of a further embodiment, the surface can be cleaned before method step b), for example by an etching process. In this embodiment, particularly effective masking by the formation of colloidal silicon oxide is made possible. To that end, the surface to be treated, for example comprising silicon oxide, can be exposed for a short time, for example, to a hydrofluoric acid solution or a hydrofluoric acid vapor in order thus to etch the surface slightly or negligibly. Such cleaned or freshly etched surfaces are particularly reactive and form particularly effectively a highly adherent colloidal silicon oxide.

Within the context of a further embodiment, the surface, in particular comprising silicon oxide, can be activated, in particular hydrophilized, before method step b). In this embodiment, the surface can be activated, for example, by the application or formation of hydroxyl groups at the surface, for example by the production of silicon hydroxide bonds (Si—OH), which can permit particularly effective masking by the formation of colloidal silicon oxide. Such a hydrophilization can take place, for example, by contacting the surface to be masked with an oxidizing component, such as, for example and without implying any limitation, an oxygen plasma, concentrated nitric acid ($HNO_3$), or a mixture of hydrogen peroxide ($H_2O_2$) with hydrochloric acid (HCl) or ammonia ($NH_3$), or hydrogen peroxide and concentrated sulfuric acid ($H_2SO_4$). Following or during such an activation step, the surface can be cleaned, as is explained in detail above, for example by exposing the surface for a short time to hydrofluoric acid solution or hydrofluoric acid vapor, in order thus to obtain a fresh and clean etching surface. A corresponding activation can also be possible for further surfaces.

It can be particularly advantageous if the surface is masked in particular immediately after a pretreatment, that is to say, for example, cleaning or activation, with formation of colloidal silicon oxide, because the reactivity or binding capacity of the oxide surfaces is then not reduced or lost through undesired contamination by impurities from the surrounding atmosphere.

Furthermore, it can also be advantageous for a negative masking, for example by means of photoresist, to be applied for pretreatments, for example as described in detail above, so that only the regions that are to be masked by colloidal silicon oxide are cleaned or hydrophilized and thus activated.

With regard to further advantages and features, explicit reference is hereby made to the explanations given in connection with the use according to the disclosure and with the component according to the disclosure. Features and advantages according to the disclosure of the method according to the disclosure are also to be applicable to the use according to the disclosure and to the component according to the disclosure and are considered to be disclosed and vice versa. The disclosure also covers all combinations of at least two of the features disclosed in the description, the claims and/or in the figures.

The disclosure further provides the use of colloidal silicon oxide for the locally selective masking of a surface to be treated. By means of colloidal silicon oxide in particular, it is possible to produce a very stable and resistant masking which is resistant to a large number of etching media and by means of which a precisely defined structure can thus be produced. The use of colloidal silicon oxide can thereby be simple and inexpensive in terms of process technology. Furthermore, despite its stability to etching with any chemicals as well as etching solutions or vapors comprising hydrofluoric acid, colloidal silicon oxide can, if desired, be removed by physical methods such as mechanical abrasion or ion sputtering processes.

With regard to further advantages and features, explicit reference is hereby made to the explanations given in connection with the method according to the disclosure and with the component according to the disclosure. Features and advantages according to the disclosure of the method according to the disclosure and of the component according to the disclosure are also to be applicable to the use according to the disclosure and are considered to be disclosed and vice versa. The disclosure also covers all combinations of at least two of the features disclosed in the description, the claims and/or in the figures.

The disclosure further provides an electronic component produced by a process comprising a masking method of the above type.

By means of such a method it is possible to produce a large number of components which comprise, for example, an oxide-containing substrate, for example a wafer substrate, which is to be processed or treated by spatially limited etching. There can be produced, for example, monolithic integrated MEMS microphones or monolithic integrated MEMS sensors which contain a micromechanical membrane part as well as a microelectronic evaluation circuit with oxide layers that are to be protected, and where a micromechanical membrane structure is to be exposed in a sacrificial oxide layer by undercutting, without damaging or destroying the adjacent circuit regions. Examples of monolithic integrated microsensors or MEMS sensors include acceleration sensors, angular rate sensors, pressure sensors and MEMS microphones.

After application of the negative masking, the surface or the substrate comprising the surface can be subjected, for example, to etching by the action of a medium comprising hydrofluoric acid, so that, for example, an undercutting of micromechanical structures, for example microphone membranes, in the sacrificial oxide layer can take place, while functional oxides, for example in a circuit region of a monolithic integrated MEMS microphone, are protected by the oxide surface passivated by colloidal silicon oxides.

With regard to further advantages and features, explicit reference is hereby made to the explanations given in connection with the method according to the disclosure and with the use according to the disclosure. Features and advantages according to the disclosure of the method according to the disclosure and of the use according to the disclosure are also to be applicable to the component according to the disclosure and are considered to be disclosed and vice versa. The disclosure also covers all combinations of at least two of the features disclosed in the description, the claims and/or in the figures.

The invention claimed is:

1. A method for masking a surface, comprising:
locating a substrate having a surface to be masked, the surface comprising silicon oxide, aluminum, or silicon; and
producing a defined masking pattern by local selective formation of colloidal silicon oxide on the surface, the formation resulting from spatially selective and successive application and drying of fluorosilicic acid ($H_2SiF_6$) on the surface.

2. The method as claimed in claim 1, further comprising:
selectively applying fluorosilicic acid to the surface by printing, spin coating, atomization, or spreading of the fluorosilicic acid; by dipping the surface in fluorosilicic acid; or by printing fluorosilicic acid onto the surface.

3. The method as claimed in claim 1, further comprising:
drying the fluorosilicic acid using an oven, a hotplate, a hot air fan, a radiant heater, or by air drying at room temperature.

4. The method as claimed in claim 1, further comprising:
masking the surface to form a negative masking pattern before producing the defined masking pattern.

5. The method as claimed in claim 4, further comprising:
producing the negative masking pattern using a photoresist.

6. The method as claimed in claim 1, further comprising:
cleaning the surface before producing the defined masking pattern.

7. The method as claimed in claim 6, wherein cleaning the surface includes etching the surface.

8. The method as claimed in claim 1, further comprising:
activating the surface before producing the defined masking pattern.

9. The method as claimed in claim 8, wherein activating the surface includes hydrophilizing the surface.

10. The method as claimed in claim 1, wherein the method is used to produce an electronic component.

11. A method for masking a surface to be treated comprising:
producing a defined masking pattern by local selective formation of colloidal silicon oxide on a surface, the formation resulting from spatially selective and successive application and drying of fluorosilicic acid ($H_2SiF_6$) on the surface; and using the produced local selective formation of colloidal silicon oxide for locally selective masking of the surface.

\* \* \* \* \*

UNITED STATES PATENT AND TRADEMARK OFFICE
CERTIFICATE OF CORRECTION

PATENT NO. : 10,490,403 B2
APPLICATION NO. : 14/783464
DATED : November 26, 2019
INVENTOR(S) : Franz Laermer It is certified that error appears in the above-identified patent and that said Letters Patent is hereby corrected as shown below:

On the Title Page

Item (56) References Cited, under Other Publications: "PCT Application No. PCT/EP20141055361" should read --PCT Application No. PCT/EP2014/055361--

Signed and Sealed this
Eleventh Day of February, 2020

Andrei Iancu
*Director of the United States Patent and Trademark Office*